(12) United States Patent
Hedler et al.

(10) Patent No.: US 6,888,256 B2
(45) Date of Patent: May 3, 2005

(54) COMPLIANT RELIEF WAFER LEVEL PACKAGING

(75) Inventors: Harry Hedler, Germering (DE); Thorsten Meyer, Erlangen (DE); Barbara Vasquez, Munich (DE)

(73) Assignee: Infineon Technologies AG (DE)

(*) Notice: Subject to any disclaimer, the term of this patent is extended or adjusted under 35 U.S.C. 154(b) by 164 days.

(21) Appl. No.: 10/032,941

(22) Filed: Oct. 31, 2001

(65) Prior Publication Data
US 2003/0080425 A1 May 1, 2003

(51) Int. Cl.$^7$ .......................... H01L 23/48; H01L 23/52; H01L 23/40
(52) U.S. Cl. ........................ 257/780; 257/783
(58) Field of Search .................. 257/783, 780, 257/781, 784, 786

(56) References Cited

U.S. PATENT DOCUMENTS

| 5,956,605 A | * | 9/1999 | Akram et al. |
| 6,002,180 A | * | 12/1999 | Akram et al. |
| 6,011,306 A | * | 1/2000 | Kimura |
| 6,040,618 A | * | 3/2000 | Akram et al. |
| 6,333,555 B1 | * | 12/2001 | Farnworth et al. |
| 6,365,974 B1 | * | 4/2002 | Abbott et al. |
| 6,548,897 B2 | * | 4/2003 | Grigg |

* cited by examiner

Primary Examiner—S. V. Clark
(74) Attorney, Agent, or Firm—Fish & Richardson P.C.

(57) ABSTRACT

A semiconductor structure includes a semiconductor substrate and a compliant interconnect element disposed on a first surface of the substrate. The compliant interconnect element defines a chamber between the first surface of the substrate and a surface of the compliant interconnect element. The compliant interconnect element can be a compliant layer. The compliant layer can be formed of a polymer, such as silicone. A conductive layer can be disposed on the compliant layer, in contact with a contact pad on the semiconductor substrate. A method for forming a semiconductor structure includes providing a semiconductor substrate and providing a compliant interconnect element on a first surface of the substrate, so that the compliant interconnect element defines a chamber between the compliant interconnect element and the first surface of the substrate.

23 Claims, 17 Drawing Sheets

US 6,888,256 B2

COMPLIANT RELIEF WAFER LEVEL PACKAGING

TECHNICAL FIELD

This invention relates to semiconductor wafer processing, and more particularly to wafer level packaging.

BACKGROUND

Traditionally, integrated circuit (IC) chips are packaged individually as single dies. Chip are packaged one at a time after the front-end processing of a semiconductor substrate is complete and the substrate is singulated into individual dies. In contrast, front-end processing steps for IC fabrication allow one to fabricate a number of chips simultaneously on a single wafer, thereby increasing throughput and cost-effectiveness. Moreover, the shrinking geometries of integrated circuits present a further limitation to traditional packaging techniques. The need for an increased density of conductive leads requires a reduction in connector pitch, both in packages and in printed circuit boards (PCB). This scaling down of geometry approaches the limits of existing packaging technology and increases packaging costs.

The challenges of shrinking geometries have been addressed by the development of ball grid arrays (BGA). BGA is an alternative packaging method that allows one to contact IC chip pads with solder balls that are later attached to printed circuit boards. The use of solder balls reduces the length of the conductive legs contacting the die, thereby lowering the parasitics of the legs at higher operating frequencies and lowering energy consumption.

Wafer level packaging (WLP) methods also address the limitations of traditional packaging techniques. WLP employs some of the processing steps used in front-end processing, such as fabrication of contacts to IC chip pads and to package many dies simultaneously. WLP can include making legs on the upper surfaces of a chip, using front-end technology. One can, therefore, simultaneously package all the chips on a single substrate cost-effectively. However, certain WLP processes have the disadvantage of packaging bad dies as well as good dies.

Three fabrication elements are needed for packaging an integrated circuit: an interconnect element between chip and package; a protective layer on the active side of the chip, such as a polyimide layer; and, in the case in which chips have pads with a low pitch, e.g. 150 $\mu$m, a redistribution of chip pads in an area array having a larger pitch, e.g. 800 $\mu$m, to allow the use of inexpensive circuit boards having larger pitches. Small footprints are achieved when the package is the same size as the chip.

A difficulty in wafer level processing results from the integration of materials having different thermal expansion coefficients. For example, a semiconductor chip is usually fabricated from silicon, which has a coefficient of thermal expansion (CTE) of approximately $3\times10^{-6}$/K. A circuit board, on the other hand, has a much higher CTE of approximately $15-18\times10^{-6}$/K. Chips and boards undergo thermal cycling during reliability testing. For example, a standardized reliability test requires cycling two times an hour between $-40°$ C. and $125°$ C. During such cycling, stress is induced, especially in the case of large chips. The board, with its higher CTE, expands more than the chip during heating. Thermal cycling can, therefore, lead to bowing of the board, excessive stresses on the chip, and, possibly, destruction of the chip and/or board.

Historically, large chips are packaged with long legs or leads (leadframe packages). These long legs can absorb stress resulting from CTE mismatch. However, this approach becomes problematic as pad pitches decrease, thereby also decreasing the leg pitch requirements to dimensions that are difficult to achieve.

An alternative approach, in which chips are soldered directly to the circuit board, fails to provide the necessary elasticity. A solder bump for connecting a chip to a PCB can be destroyed during soldering, thermal cycling, or burn-in because of CTE mismatch and the non-compliance of the solder bump. This presents a reliability risk, especially for large chips, i.e. chips having solder balls at a distance greater than 5 mm from a neutral point. One solution is to provide a polymeric underfill, thereby enabling the chip to adhere to the PCB. The underfill serves as a stress absorber. A packaged die is soldered to the board, after which underfill is applied to the package and hardened. This resulting structure reduces the stress on the legs or solder balls. The underfill, however is hard and will tend to absorb stress, thereby causing the board to bend. Commonly used underfill processes do not fulfill the need for short process time as well as low process cost.

SUMMARY

In an aspect of the invention, a semiconductor structure includes a semiconductor substrate and a compliant interconnect element disposed on a first surface of the substrate. The compliant interconnect element defines a chamber between the first surface of the substrate and a surface of the compliant layer.

Embodiments of this aspect of the invention can include the following features. The compliant interconnect element is a compliant layer. The compliant layer includes a polymer. The polymer includes silicone. The chamber is surrounded on all of its sides by the compliant layer and the first surface of the chip. The chamber has a height within the range of 50 $\mu$m to 200 $\mu$m. The compliant layer has a thickness within the range of about 5 $\mu$m to about 500 $\mu$m. The substrate includes a device. The device includes an integrated circuit. The device includes a micro-electro mechanical system. An encapsulation layer is disposed on a second surface of the semiconductor substrate.

The structure includes a first conducting pad on the substrate and a conducting layer, disposed on the compliant interconnect element in contact with the first conducting pad. The conducting layer includes metal. The metal is selected from the group of titanium, copper, nickel, and gold. The conducting layer has a thickness within the range of about 2 $\mu$m to about 5 $\mu$m.

The structure has a plurality of conducting pads on the substrate, with the conductive layer including a plurality of lines. Each of the lines contacts one of the plurality of conducting pads, and the lines defining a pad redistribution pattern.

The structure includes a printed circuit board having a second conducting pad, with the second conducting pad being in electrical communication with the first conducting pad on the substrate via the conducting layer.

In another aspect of the invention, a method for forming a semiconductor structure is provided. The method includes providing a semiconductor substrate and providing a compliant interconnect element on a first surface of the substrate, such that the compliant interconnect element defines a chamber between the compliant layer and the first surface of the substrate.

Embodiments
of this aspect of the invention can include
the following. Providing the compliant interconnect element includes providing a compliant layer. The compliant layer is provided by comprises providing a transfer substrate having a compliant layer disposed thereon. Providing a transfer substrate includes providing a glass substrate. Providing a semiconductor substrate includes providing a plurality of singulated die, each of the die including a semiconductor device. Each one of the plurality of singulated die is encapsulated in a protective material to form a reconstituted wafer.

An advantage of an embodiment of the invention is that a semiconductor structure compliant layer defining a chamber allows for more elastic in-plane behavior in the x-y plane during temperature changes. The stress generated by the different coefficients of thermal expansion of a chip and a board can be relaxed by the compliant air gaps.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

A method is described for forming an interconnect element as part of the structure of a semiconductor device package, with a compliant layer defining a chamber between the semiconductor substrate surface and a surface of the compliant layer. The chamber, an air gap surrounded by compliant material, increases the compliance available in a chip package. This compliancy reduces the chances of breakage of chip to board interconnect during thermal cycling. The package structure is formed by primarily using techniques similar to those used for front-end processing.

Figure 1:
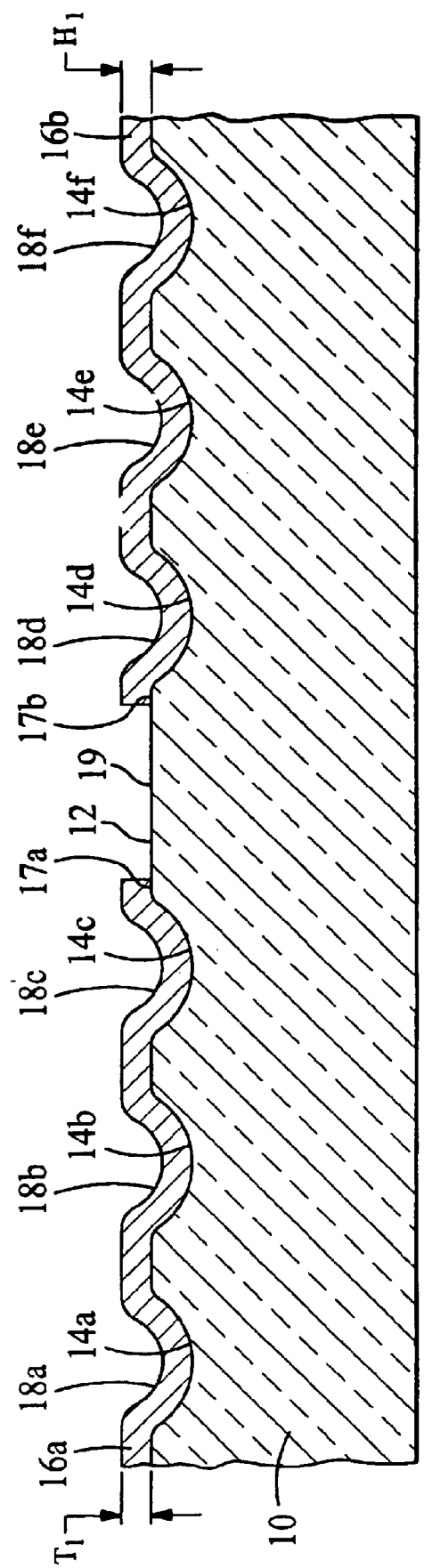
FIGS. 1–6 are cross-sectional views of a semiconductor structure at subsequent stages in the fabrication thereof in accordance with one embodiment of the invention.

Referring to FIG. 1, in a first embodiment, a transfer substrate 10 has a surface 12 defining grooves 14a–14f. Transfer substrate 10 has the same diameter and shape as a semiconductor wafer, e.g., round with a diameter of 8 inches. It is rigid and transparent, and made of, for example, glass. Grooves 14a–14f are formed by a photolithographic pattern definition followed by a wet etch. Transfer substrate 10 with grooves made to specification can be obtained from commercial vendors, e.g. NGK or Day Nippon, both based in Japan. A thin monoatomic layer 17 of an adhesive material, such as polypropylene, is deposited on a top surface 19 of transfer substrate 10, covering it completely. A compliant dielectric layer 16a, 16b is applied to transfer substrate 10 by printing with a thick film printing system, e.g., an E5 system, manufactured by EKRA, having a manufacturing center in Bönningheim, Germany. Compliant dielectric layer 16a, 16b is a compliant material, e.g., silicone, having a low elastic modulus. Compliant dielectric layer 16a, 16b has a thickness $T_1$ of, e.g., 100 $\mu$m. Dielectric layer 16a, 16b conformally covers grooves 14a–14f of transfer substrate 10, thus forming bumps 18a–18f. Bumps 18a–f have a height $H_1$ of, e.g., 50 $\mu$m–500 $\mu$m. $H_1$ is selected such that bumps 18a–18f are high enough to provide adequate compliance without causing the final package to have an excessive height. Compliant dielectric layer 16a, 16b is sticky directly after deposition, because silicone is a material which cures only above room temperature.

Figure 2:
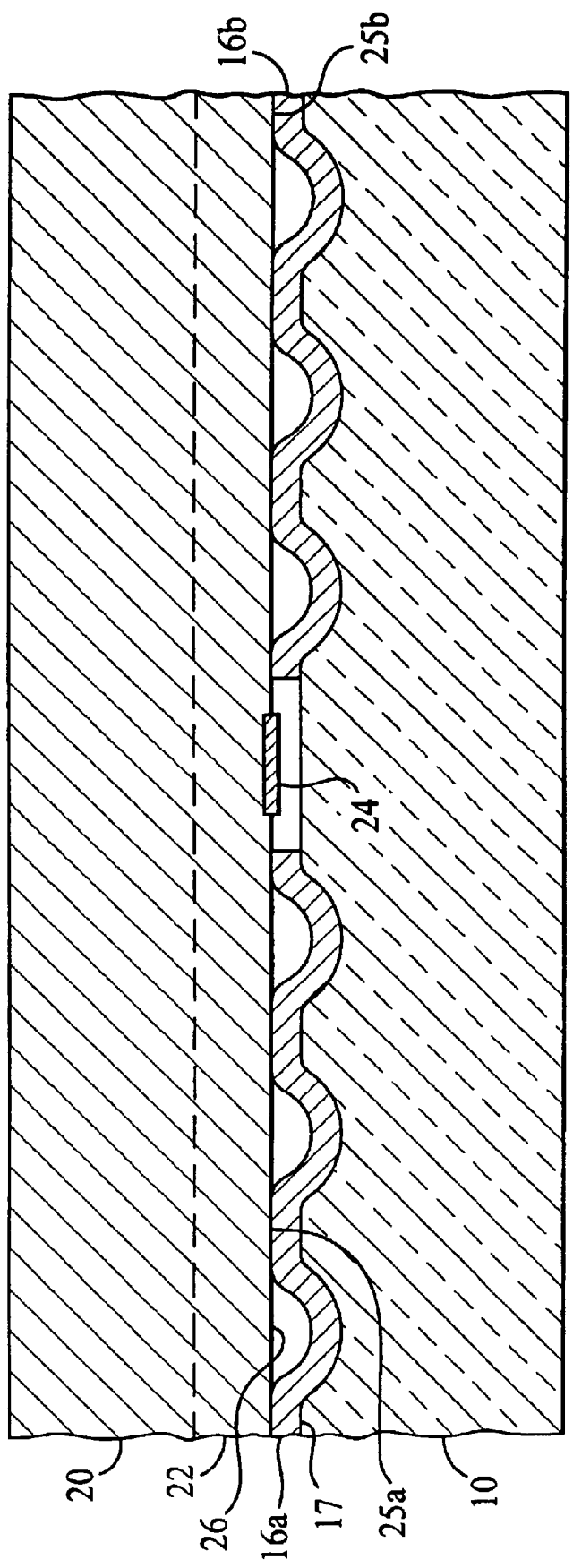

Referring to FIG. 2, a semiconductor substrate 20 has an integrated circuit 22 formed in an upper portion. Integrated circuit 22 includes a metal contact pad 24, typically made of aluminum. Semiconductor substrate 20 and transfer substrate 10 are placed in a die bonding machine, such as an EV501 system, manufactured by EVG, based in Schaerding, Austria. Semiconductor substrate 20 is flipped over, aligned with the patterned compliant dielectric layer 16a, 16b, and pressed against transfer substrate 10 such that a dielectric surface 25a, 25b of compliant dielectric layer 16a, 16b contacts a substrate surface 26 of semiconductor substrate 20 proximate to integrated circuit 22. Alignment is facilitated by the transparency of glass transfer substrate 10. Compliant dielectric layer 16a, 16b is still sticky and adheres to semiconductor substrate surface 26. Compliant dielectric layer 16a, 16b is cured in the bonding machine. For a silicone dielectric, the curing temperature is 150° C. and the curing time is at least 30 minutes. Excessively high curing temperatures are avoided, to prevent the destruction of integrated circuit 22. After curing, compliant dielectric layer 16a, 16b adheres strongly to semiconductor substrate surface 26. Thin monoatomic layer 17 ensures that compliant dielectric layer 16a, 16b adheres more strongly to semiconductor substrate surface 26 than to transfer substrate 10.

Figure 3:
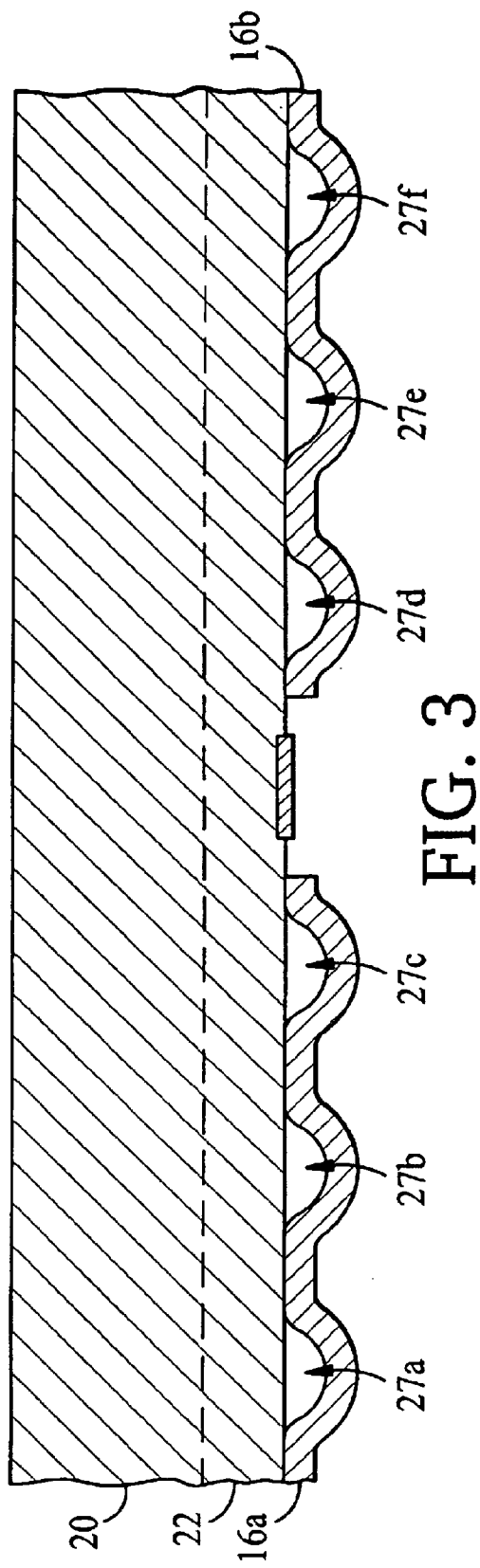

Referring also to FIG. 3, after the curing step, transfer substrate 10 is pulled off from compliant dielectric layer 16a, 16b, leaving compliant dielectric layer 16a, 16b bonded to surface 26 of semiconductor substrate 20. Transfer substrate 10 is also pulled off in the die bonder. Semiconductor substrate surface 26 and dielectric surface 25a, 25b of compliance layer 16a, 16b define chambers 27a–27f therebetween. Chambers 27a–27f are, therefore, air gaps enclosed by compliant dielectric layer 16a, 16b and semiconductor substrate.

Figure 4:
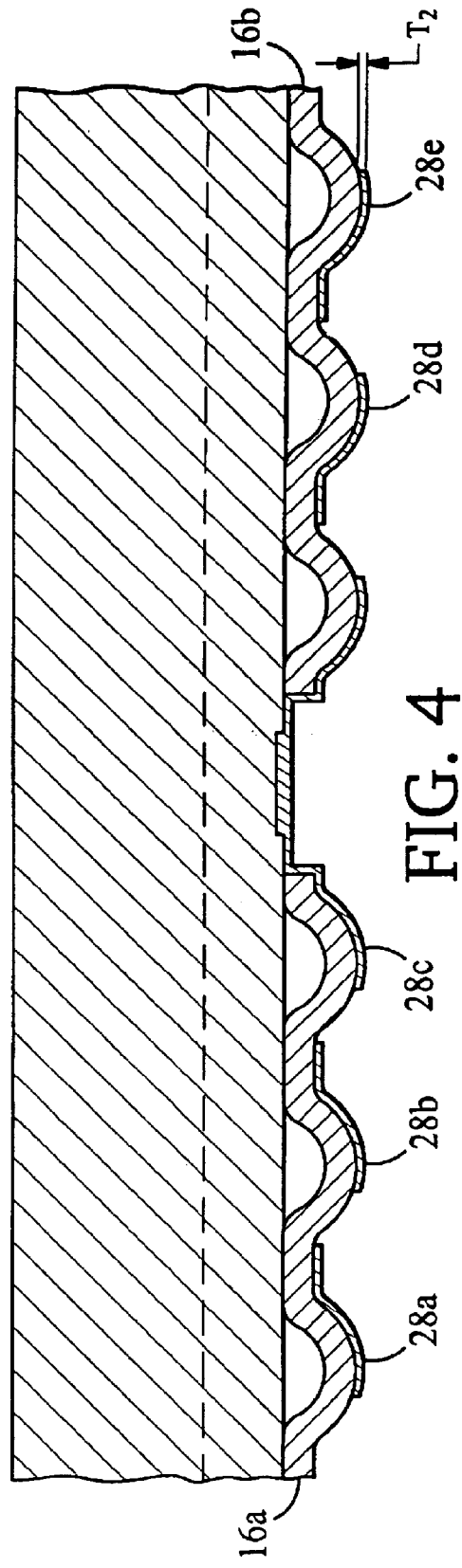
Figure 4A:
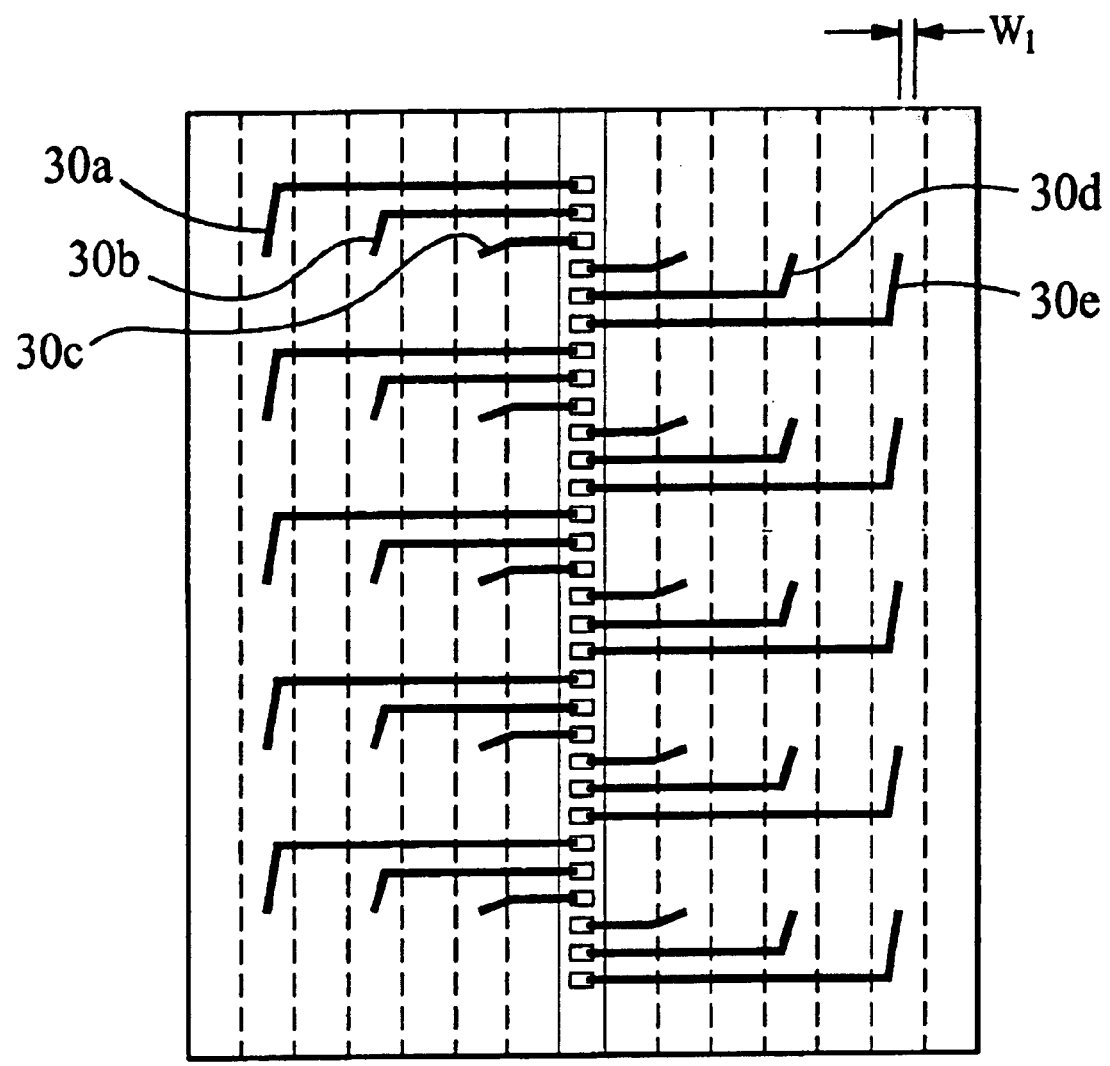
FIG. 4A is a top view of the semiconductor structure illustrated in FIG. 4.

Referring to FIG. 4, a metallization layer 28a–28e is sputtered onto compliant dielectric layer 16a, 16b, in a sputtering system such as the Clusterline system, manufactured by Unaxis, based in Switzerland. Metallization layer 28a–28e includes a seed layer of titanium, having a thickness of 50 nm. Subsequently, a layer of copper is sputtered onto the titanium. Metallization layer 28a–28e is sufficiently thin to be flexible, not rigid. It has a thickness $T_2$ of approximately 2–5 $\mu$m, preferably 4 $\mu$m. Photoresist (not shown) is applied to metallization layer 28a–28e to form a photoresist layer. The material forming the photoresist layer contains dipoles, and can therefore be applied to metallization layer 28a–28e by electrodeposition. The electrodeposited photoresist has a uniform thickness of, e.g., 1 $\mu$m. A suitable photoresist material is PEPR 2400, available from Shipley, based in Marlborough, Mass. An electrodeposition system suitable for depositing photoresist is the Equinox™, available from Semitool, based in Kalispell, Mont. Because of the variation in height of compliant dielectric layer 16a, 16b, the large depth of focus of a proximity aligner renders proximity alignment a suitable method for patterning the photoresist layer. An example of a suitable proximity aligner is the MA200 aligner, manufactured by Süss MicroTech, based in Munich, Germany. Metallization layer 28a–28e is then dry etched in a metal etcher manufactured by Applied Materials, based in Santa Clara, Calif., USA. Referring also to FIG. 4A, metal lines 30a–30e are thereby defined. Metal lines 30a–30e have a width $W_1$ of, e.g., 12 μm.

Figure 5A:
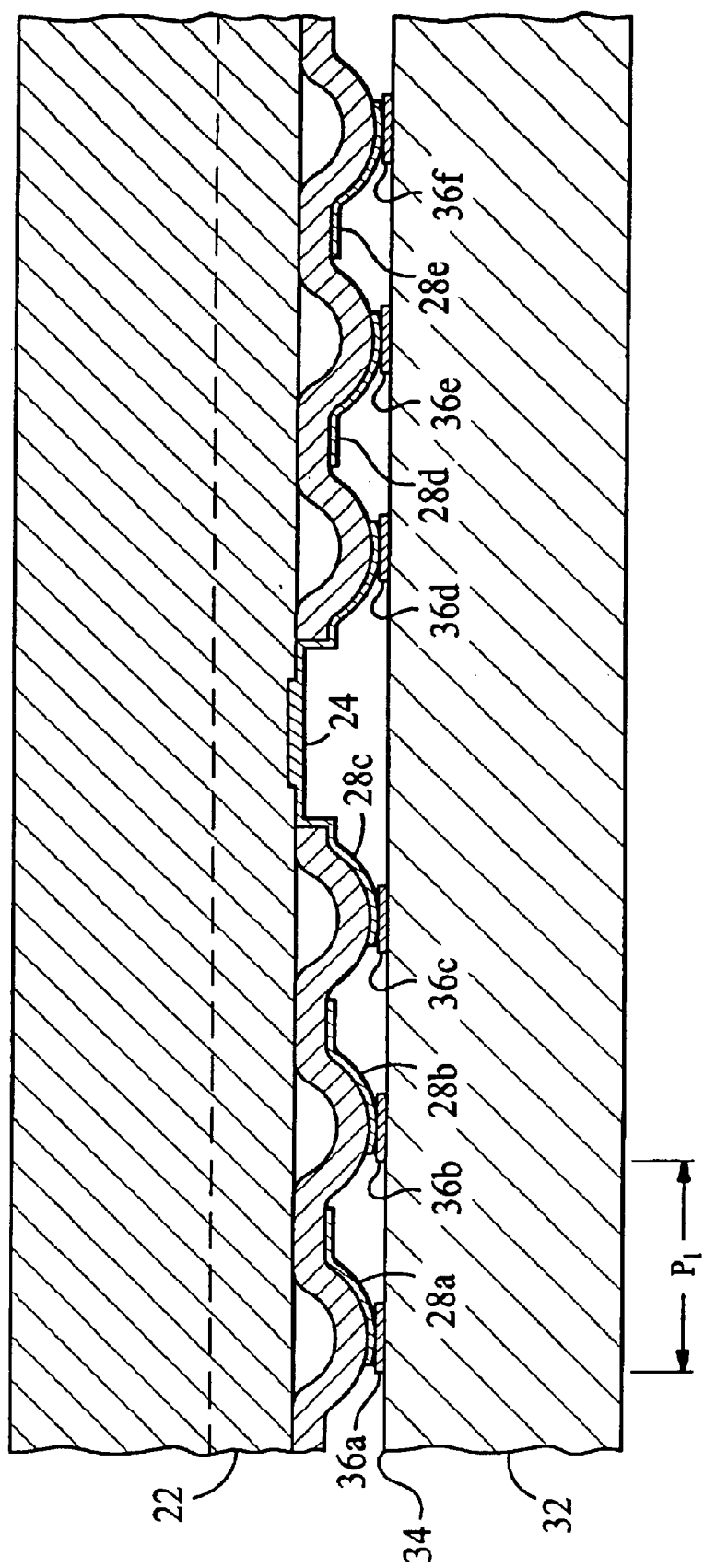
Figure 5B:
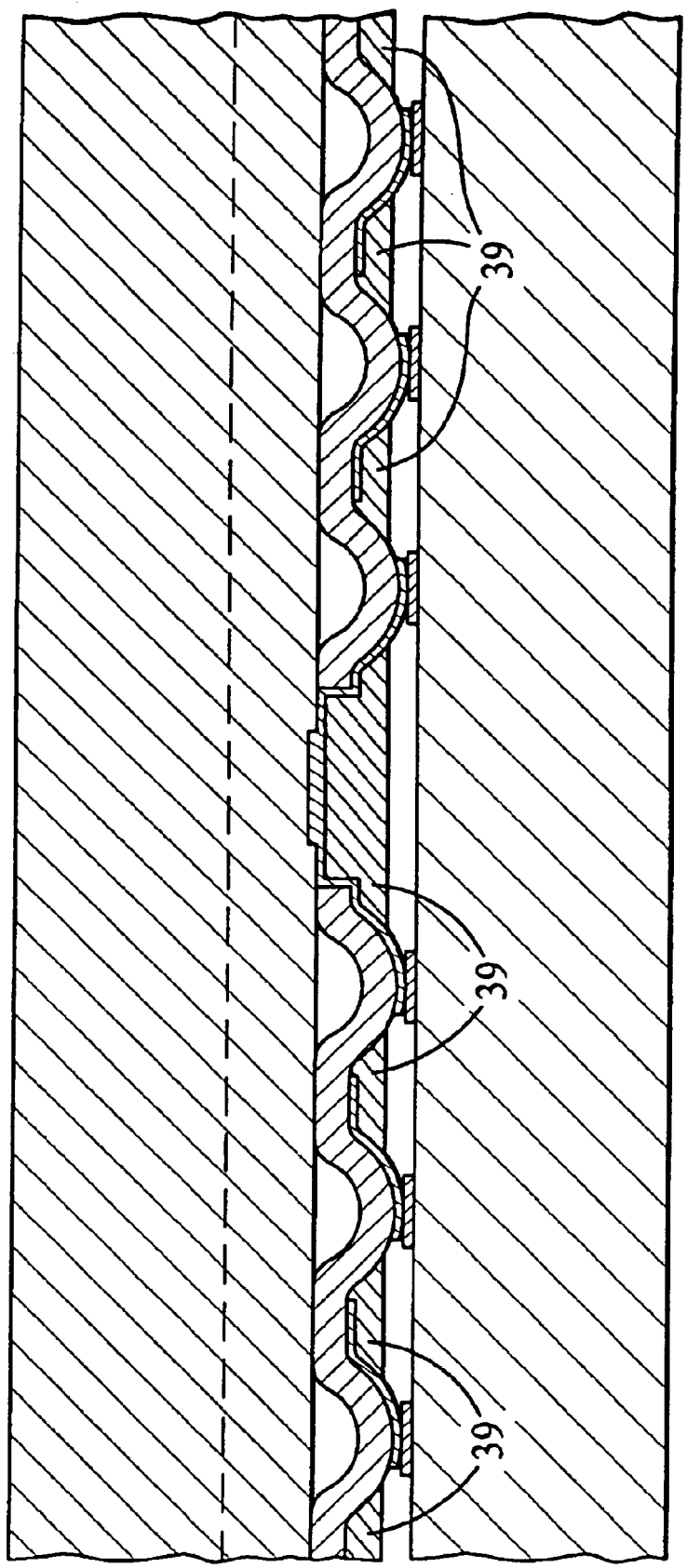

Referring also to FIG. 5A, a test board 32 has the same dimensions as semiconductor substrate 20 or larger. Test board 32 has a top surface 34 on which conductive contacts 36a–36f are disposed. Conductive contacts are, e.g., solder bumps made of a lead/tin alloy. Conductive contacts 36a–36f have a pitch $P_1$ of, e.g., a standard length of 800 μm. Conductive contacts 36a–36f are pressed against metallization layer 28a–28e. Test board 32 thereby makes electrical contact to metal contact pad 24. The functionality of integrated circuit 22 is then tested. This can include testing of electrical characteristics or testing performance as a function of temperature. Referring to FIG. 5B, in the case of subsequent solder assembly to an application board, a solder stop layer 39 is applied prior to testing. Solder stop layer 39 is made of the same material as compliant dielectric layer 16a, 16b, e.g., silicone, and is applied by printing. If subsequent assembly will be performed with a pressure contact or a glue/conductive adhesive contact, see, e.g. FIG. 13, no further encapsulation is needed. After testing, semiconductor substrate 20 is singulated into individual dies.

Figure 6:
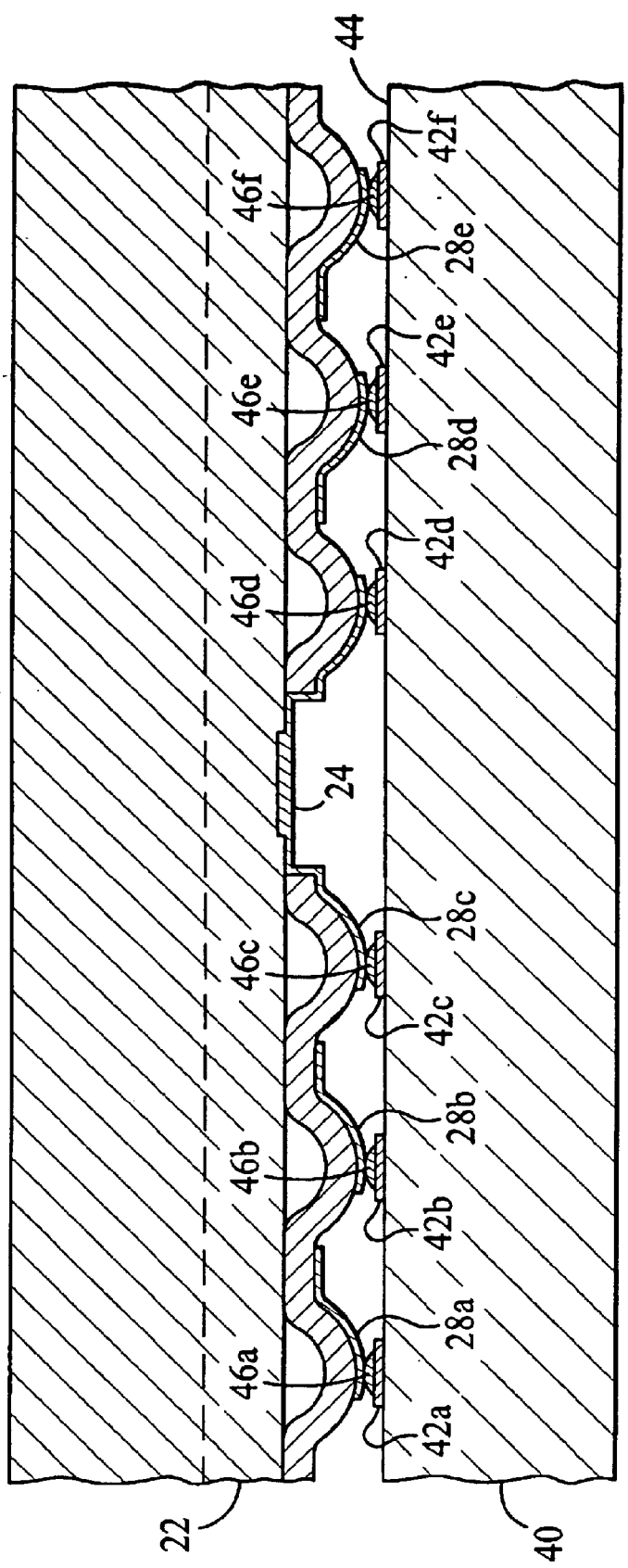

Referring also to FIG. 6, printed circuit board 40 has conductive contacts 42a–42f on a top surface 44. Conductive contacts 42a–42f are soldered and connected with solder connections 46a–46b to metallization layer 28a–28e to form an electrical contact between printed circuit board 40 and integrated circuit 22 through contact pad 24. The soldering material is a lead/tin alloy.

Figure 7:
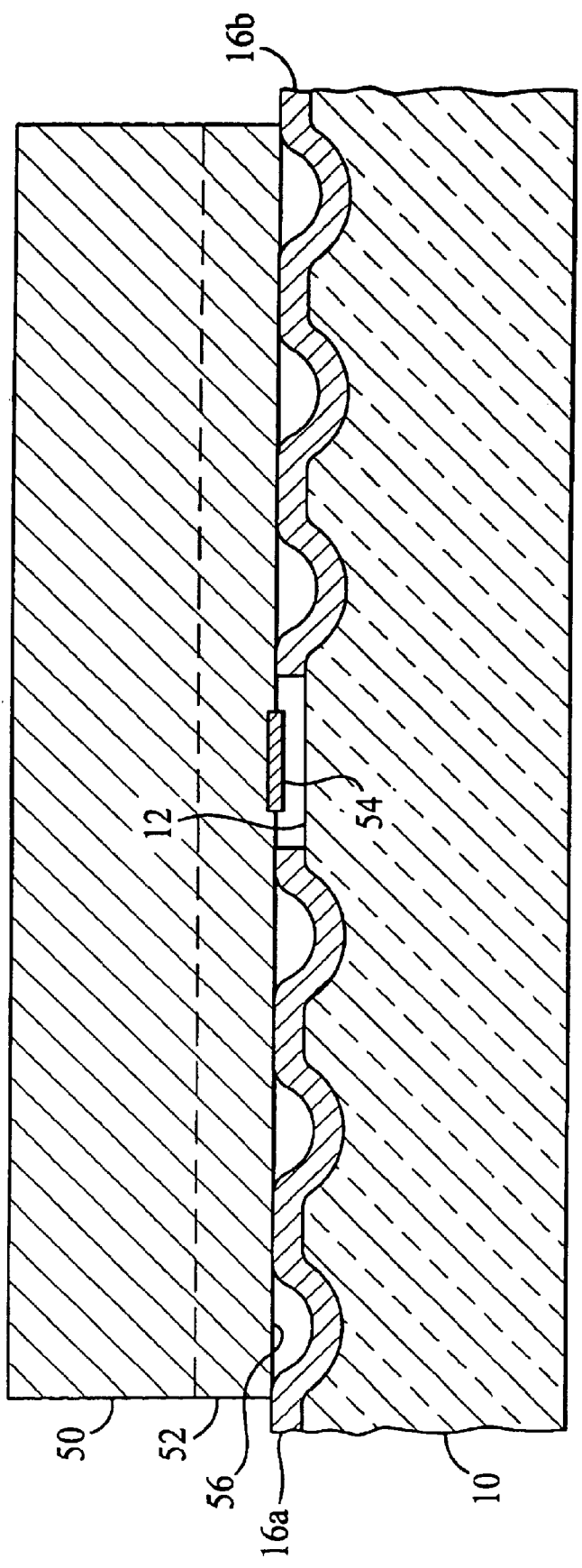
FIGS. 7–13 are cross-sectional views of a second semiconductor structure at subsequent stages in the fabrication thereof in accordance with another embodiment of the invention.
Figure 7A:
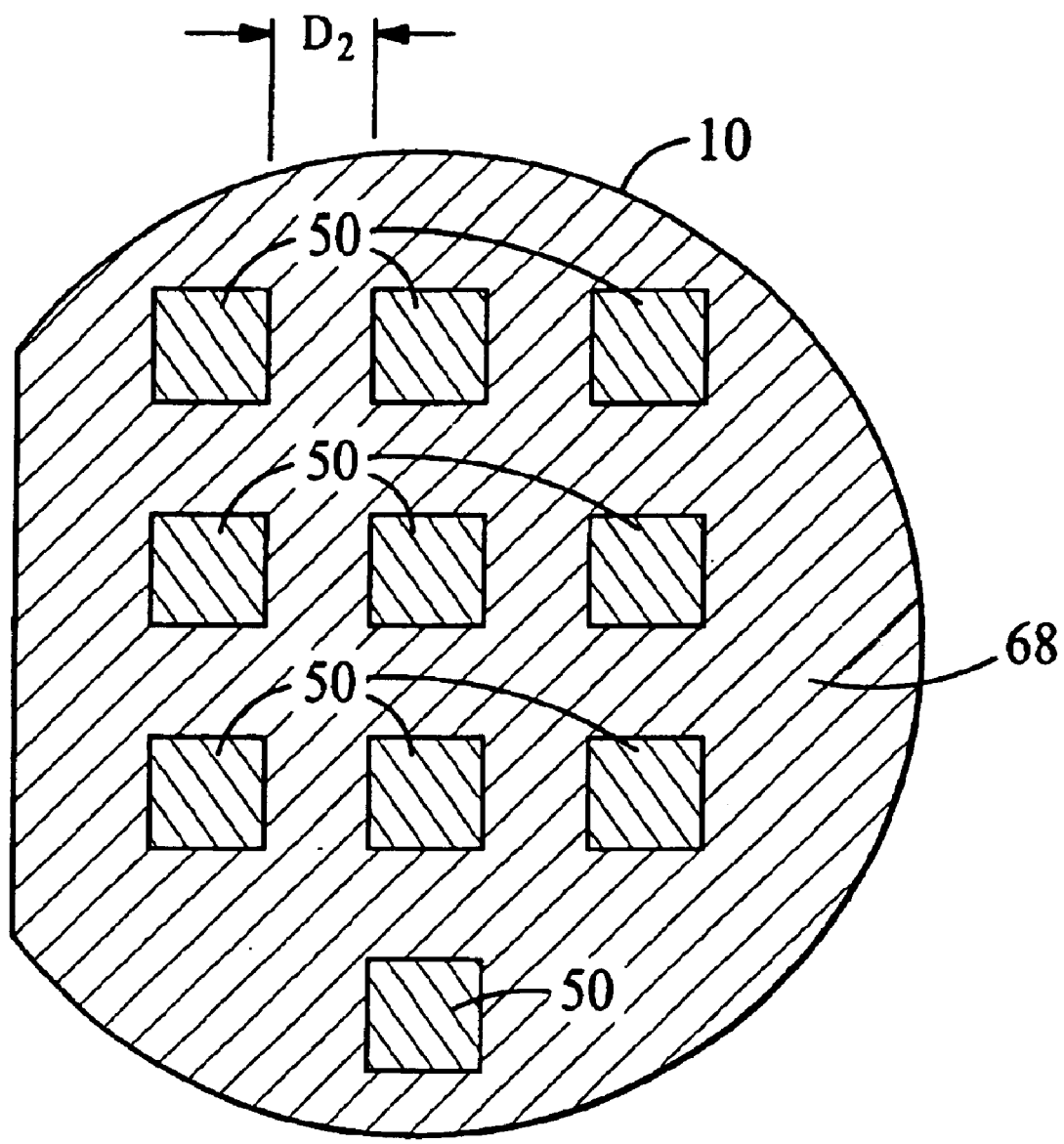
FIG. 7A is a top view of a plurality of the single semiconductor structure illustrated in FIG. 7.

Referring to FIG. 7, in an alternative embodiment, compliant dielectric layer 16a, 16b is applied only to singulated good die having integrated circuits devices meeting functionality specifications, instead of to entire semiconductor wafer 20 having both good and bad die. A singulated good die 50 has an integrated circuit 52 formed in an upper portion thereof. Die 50 has been verified as a good die by prior testing of integrated circuit 52. Integrated circuit 52 includes a metal contact pad 54. The contact pad 54 is formed from aluminum. Singulated die 50 and transfer substrate 10 are placed in a die bonding machine, such as EV501. The die-bonding machine flips over singulated die 50 so that a die top surface 56 faces down, aligns die 50 with the patterned dielectric layer 16a, 16b, and presses die 50 against transfer substrate 10 such that a surface 25a, 25b of dielectric layer 16a, 16b contacts die surface 56 of die 50. Compliant dielectric layer 16a, 16b is still sticky and adheres to surface 56. Compliant dielectric layer 16a, 16b is cured in the bonding machine at, e.g., 150° C., the curing temperature of silicone, for at least 30 minutes. After curing, compliant dielectric layer 16a, 16b adheres strongly to die surface 56. Further, the presence of thin monoatomic layer 17 on surface 19 of transfer substrate 10 ensures that compliant dielectric layer 16a, 16b adheres more strongly to die surface 56 than to transfer substrate 10. Referring also to FIG. 7A, the procedure of flipping good die 50' over and pressing the good die 50' against transfer substrate 10 is repeated until transfer substrate 10 is covered with good dies 50'. A distance $D_2$ between die is, e.g., >~50 μm, preferably between 100 μm and 600 μm.

Figure 8:
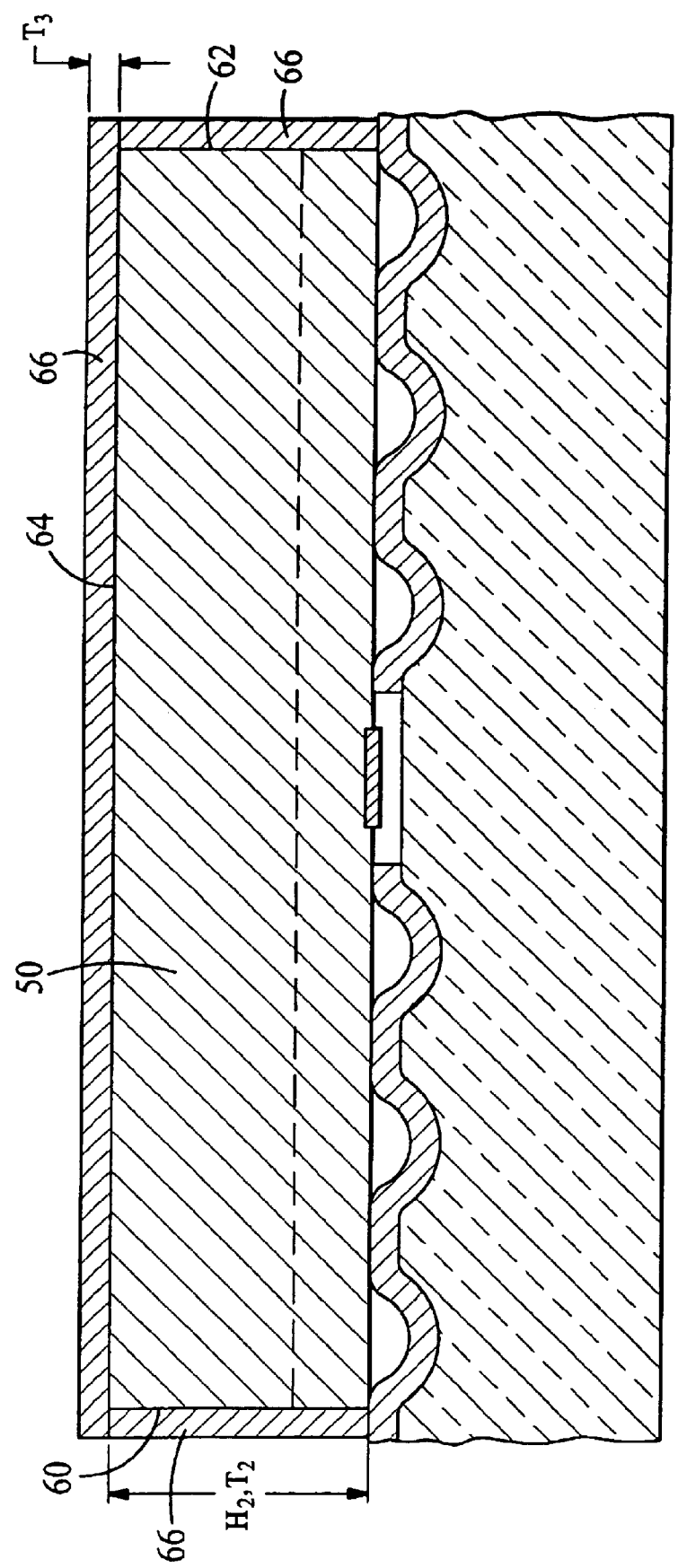

Referring also to FIG. 8, die 50 is encapsulated on its sides 60, 62 and on its backside 64 with an encapsulating material 66, e.g., silicone, available from Wacker, based in Germany. Encapsulating material 66 is deposited on die 50 by printing using a thick film printer, such as the E5 system manufactured by EKRA. Encapsulating material 66 completely fills voids 68 between dies 50, 50'. A thickness $T_2$ of encapsulating material 66 between dies 50, 50' is, therefore, the same as a height $H_2$ of dies 50, 50', e.g., ~100 μm to 500 μm, preferably 380 μm. Encapsulating material 66 has a height $T_3$ above die backside 64 of, e.g., ~20 μm to 200 μm.

Figure 9:
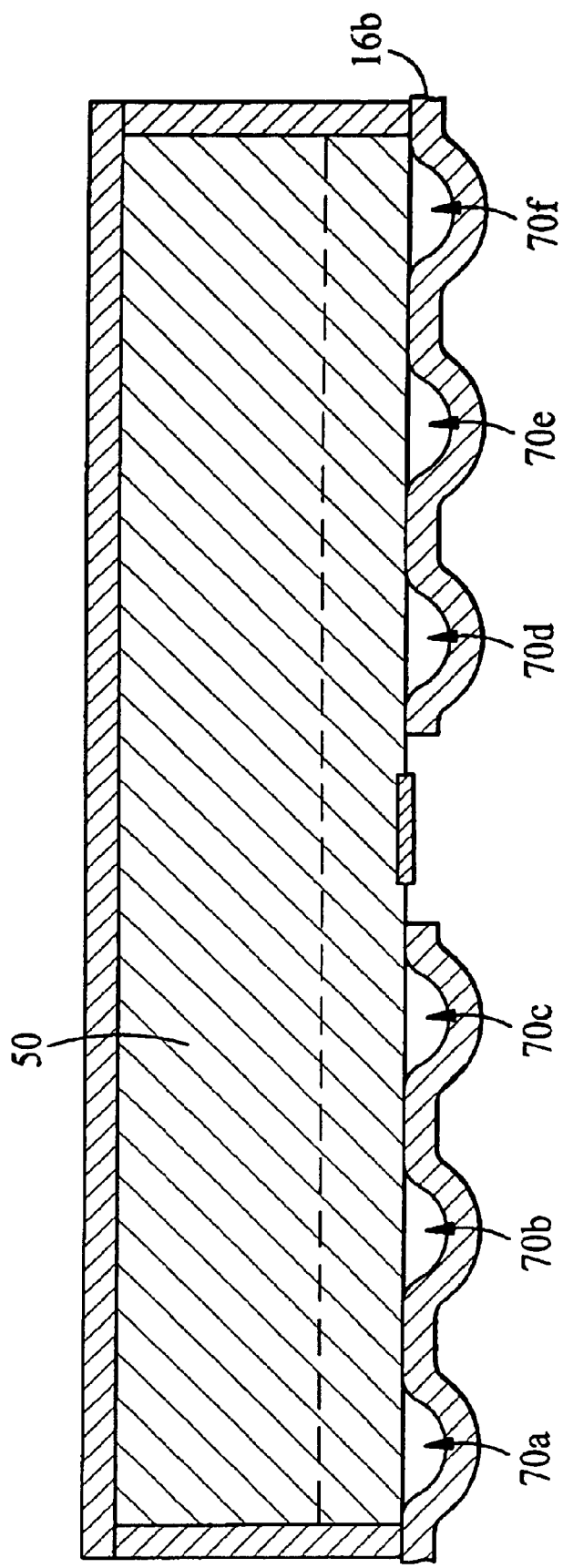
Figure 9A:
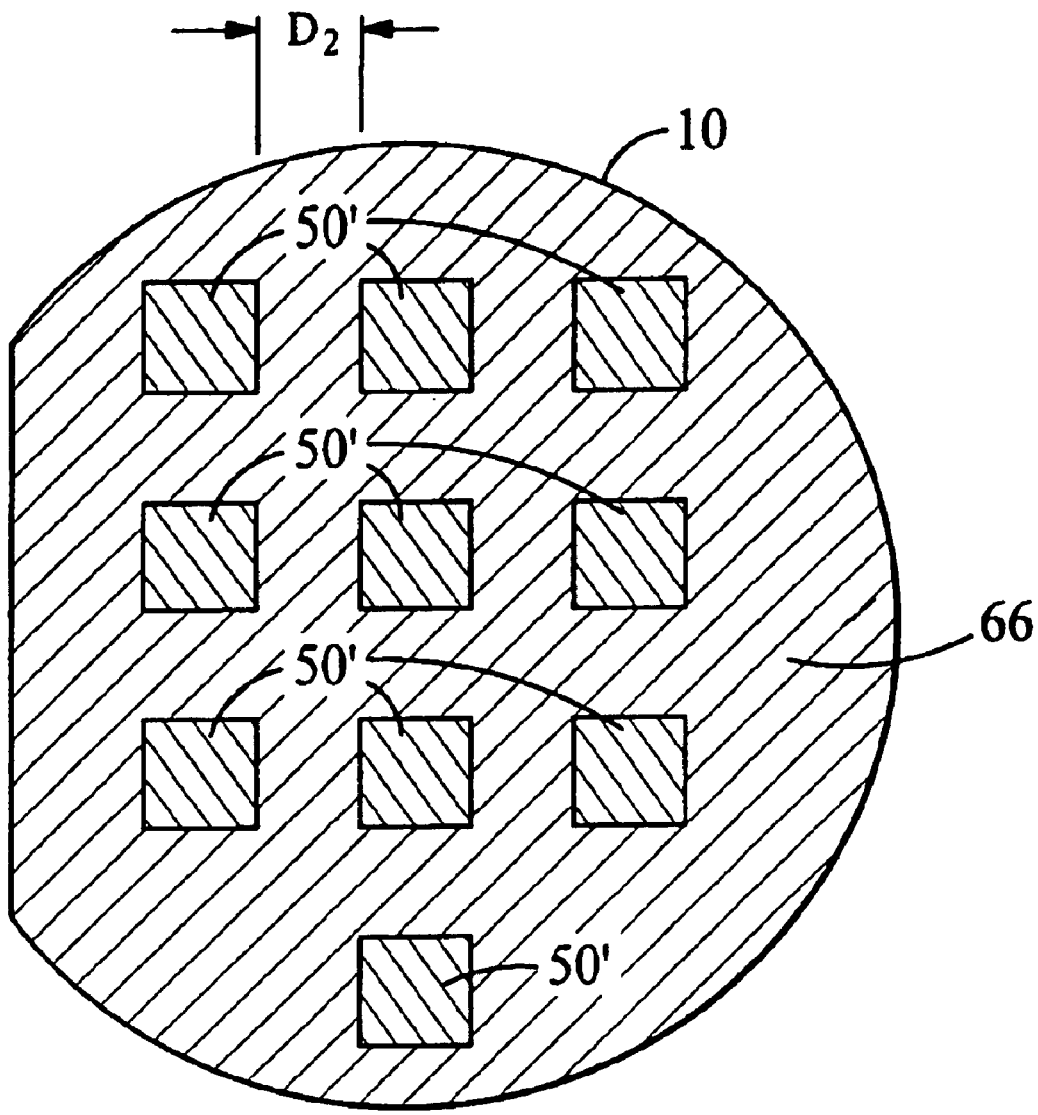
FIG. 9A is a top view of a plurality of the single semiconductor structure illustrated in FIG. 9.

Referring also to FIG. 9, after the curing and encapsulation steps, transfer substrate 10 is pulled off from compliance dielectric layer 16a, 16b, leaving compliance dielectric layer 16a, 16b bonded to surface 56 of die 50. Transfer substrate 10 is pulled off in the die bonds. Chambers 70a–70f are defined between die surface 56 and surface 25a, 25b of compliance dielectric layer 16a, 16b. Chambers 70a–70f are air gaps enclosed by compliance dielectric layer 16a, 16b. Referring also to FIG. 9A, singulated dies 50, 50' are bonded to each other by encapsulating material 66, thereby forming a reconstituted wafer 71, consisting of functional die.

Figure 10:
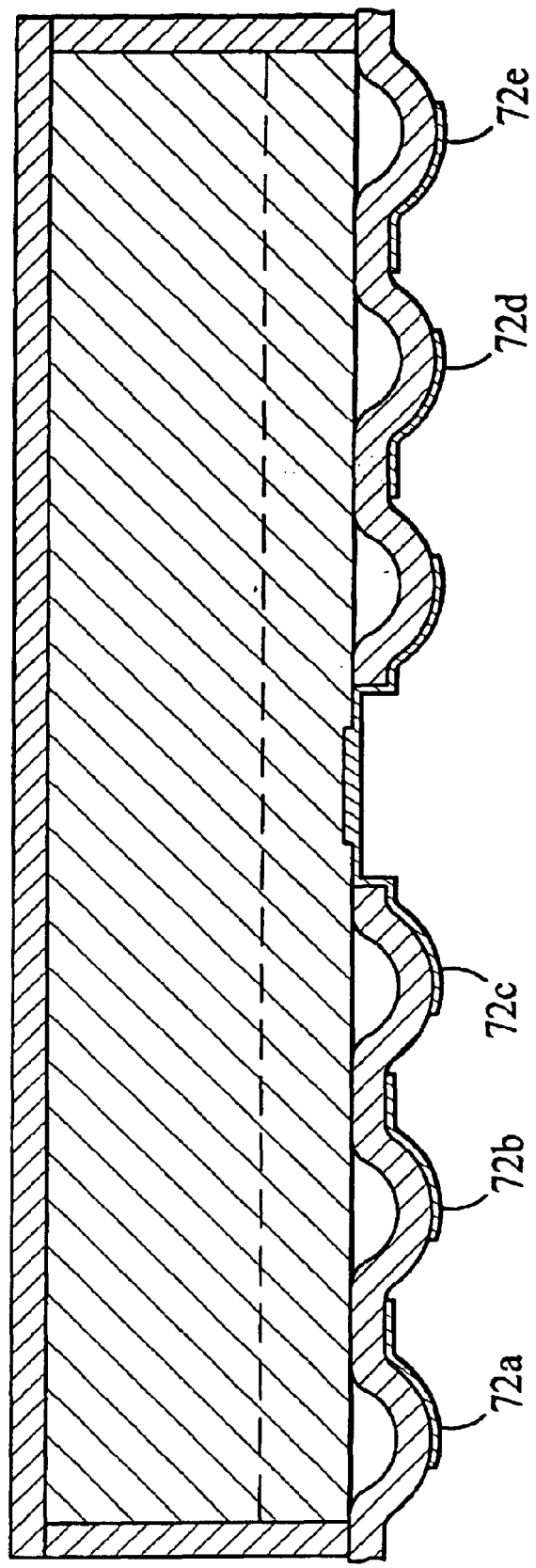
Figure 10A:
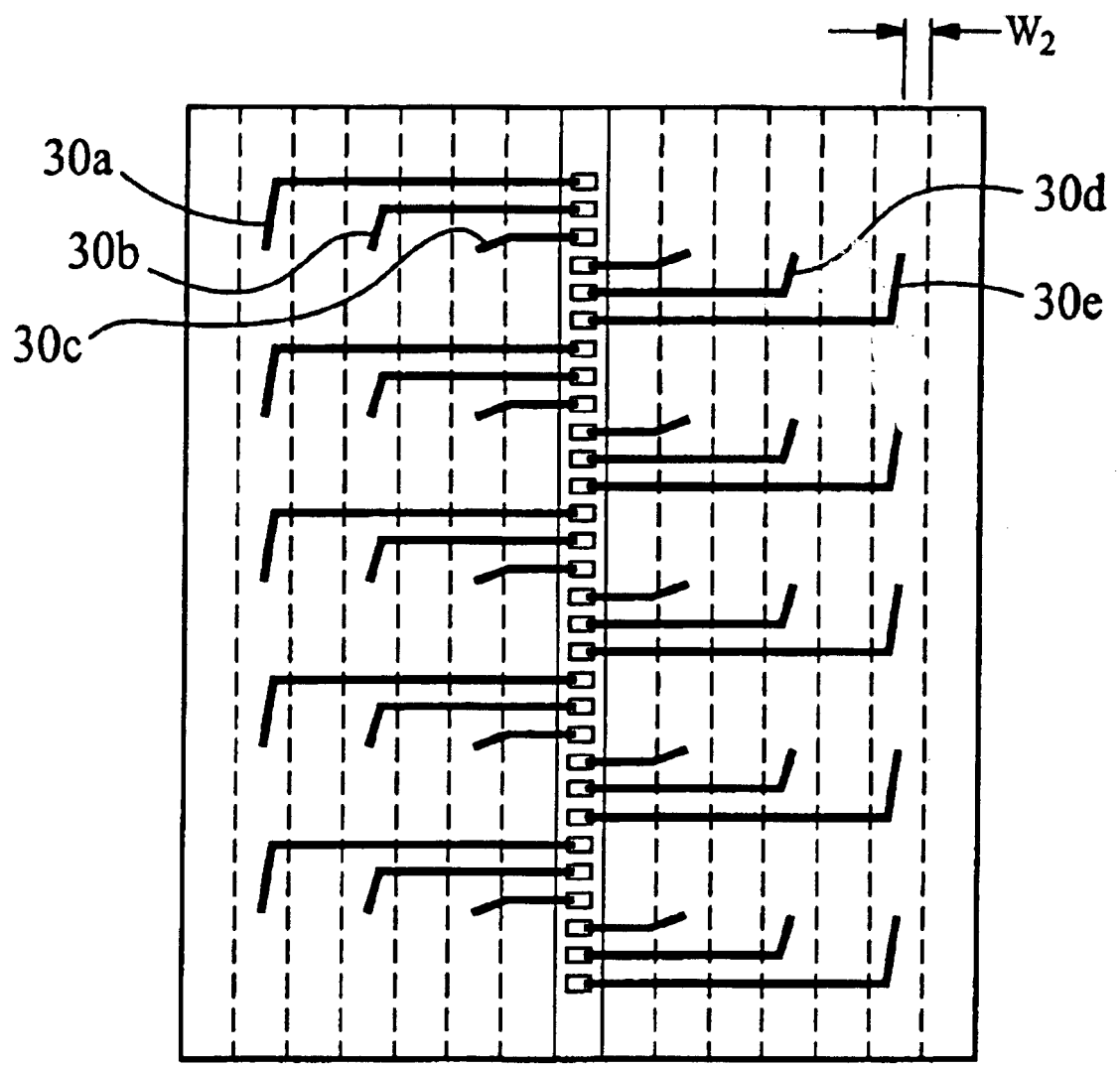
FIG. 10A is a top view of the semiconductor structure illustrated in FIG. 10.

Referring also to FIG. 10, a metallization layer 72a–72e is sputtered onto compliant dielectric layer 16a, 16b, in, e.g., a Clusterline system. Metallization layer 72a–72e includes a seed layer of titanium, having a thickness of 50 nm. Subsequently, a layer of copper is sputtered onto the titanium. Metallization layer 72a–72e has a thickness $T_2$ of approximately 2 μm–5 μm, preferably 4 μm. Metallization layer 72a–72e is sufficiently thin such that metallization layer 72a–72e is flexible, not rigid. A photoresist layer (not shown) is applied to metallization layer 72a–72e. The photoresist layer contains dipoles, and thereby is suitable for application to metallization layer 72a–72e by electrodeposition. The photoresist is, e.g., PEPR 2400 deposited in an electrodeposition system such as the Equinox™. Dielectric layer 16a, 16b varies in height. Proximity alignment is a suitable method, therefore, for patterning the photoresist layer of the dielectric layer 16a, 16b, because of the large depth of focus of a proximity aligner. An example of a suitable proximity aligner is the MA200, Süss MicroTech. Metallization layer 72a–72e is then dry etched in an etching system, such as a system manufactured by Applied Materials. Referring also to FIG. 10A, metal lines 30a–30e are thereby defined. Metal lines 30a–30e have a width $W_2$ suitable for serving as an interconnect without having a pitch that is unnecessarily large, thereby consuming valuable chip real estate. This width, $W_2$, is, for example, 12 μm.

Figure 11:
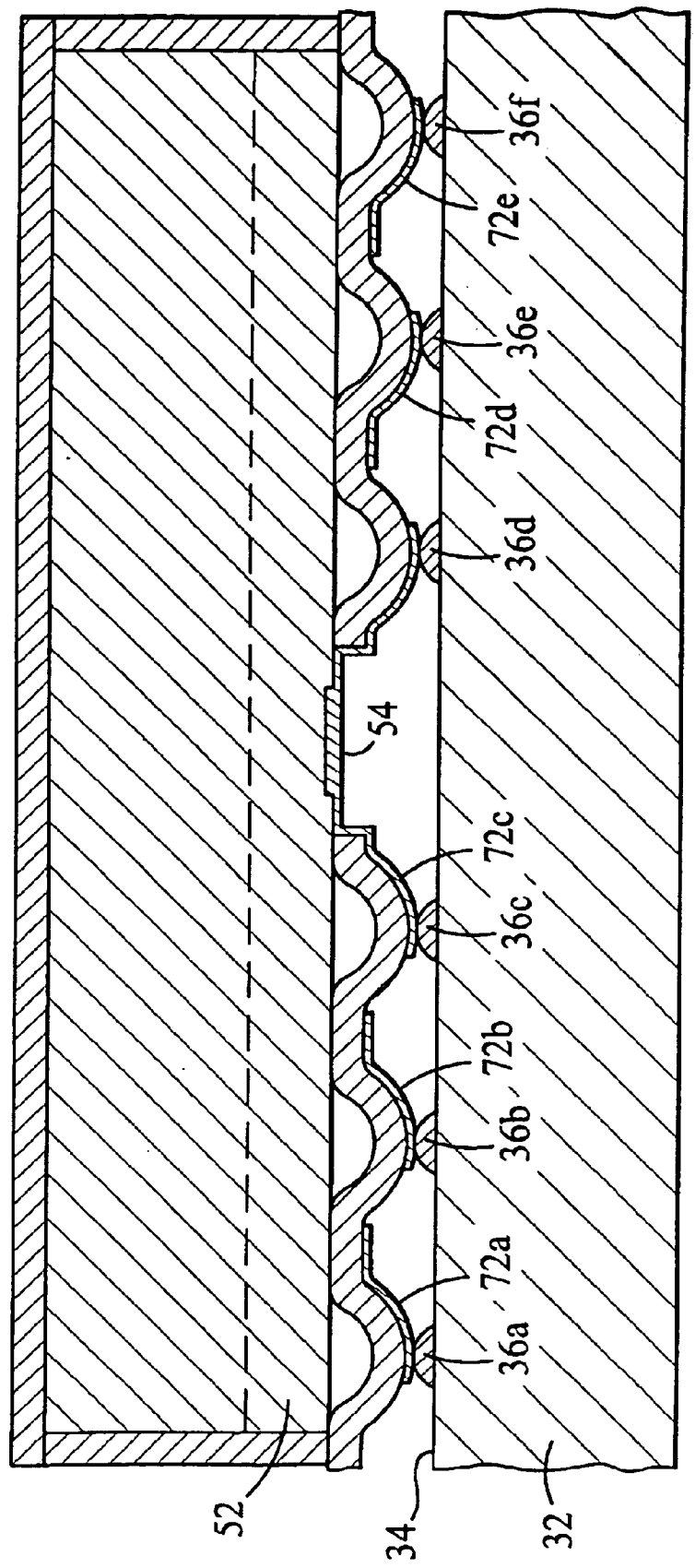

Referring also to FIG. 11, a test board 32 has the same dimensions as reconstituted wafer 71, e.g., the size of a commercially available wafer for which processing equipment is designed to handle, such as round with a diameter of 8 inches. Test board 32 has a top surface 34 on which conductive contacts 36a–36f are disposed. Conductive contacts 36a–36f are, e.g., solder bumps made of a lead/tin alloy. Conductive contacts 36a–36f are pressed against metallization layer 72a–72e. Test board 32 thereby makes electrical contact to metal contact pad 54. The functionality of integrated circuit 52 is then tested, both in terms of electrical characteristics as well as performance as a function of temperature.

After integrated circuit 52 is tested, the reconstituted wafer is singulated into individual dies 50, 50'. Because dies 50, 50' are already encapsulated by encapsulating material 66, they do not require further encapsulation after singulation. If, however, dies 50, 50' were to be soldered to a board, the formation of a solder stop layer 39 would be advantageous, as discussed above with reference to FIG. 5B.

Figure 12:
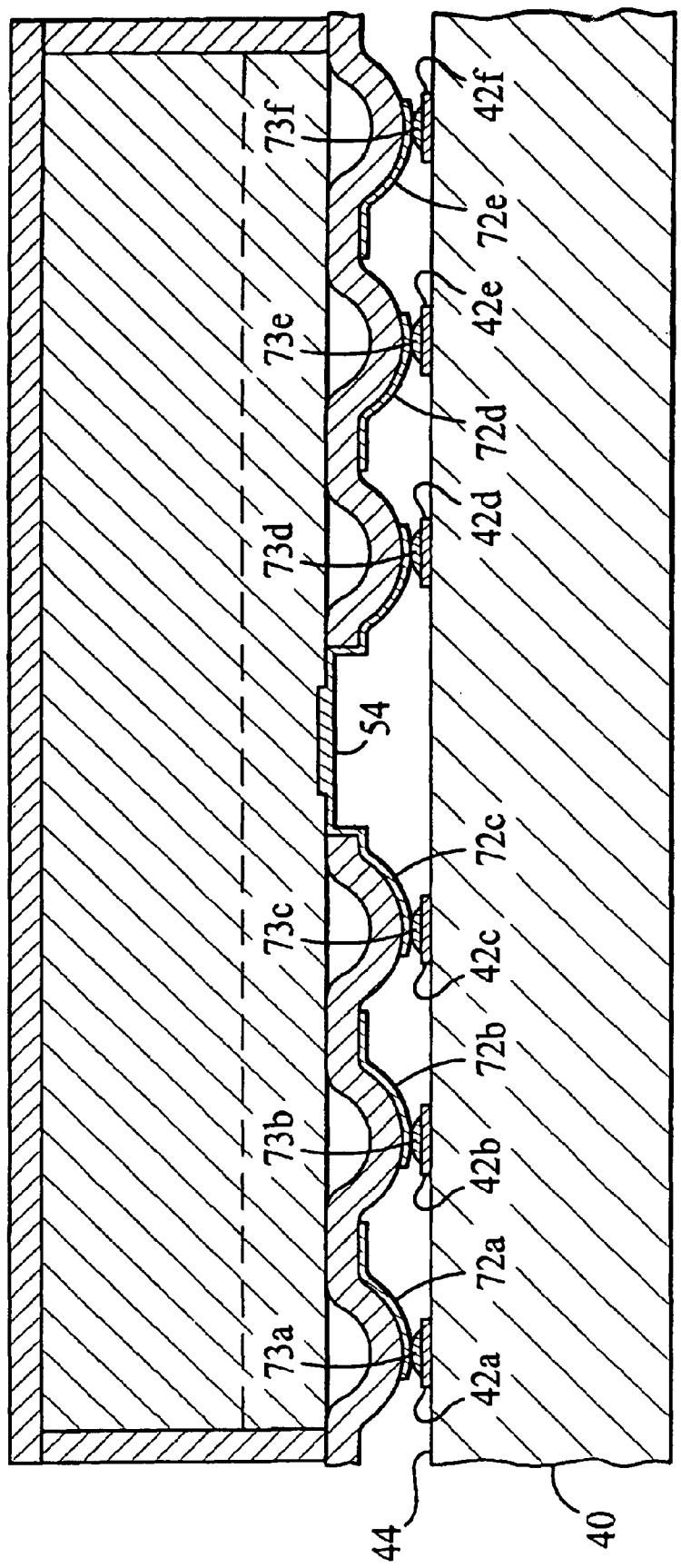

Referring to FIG. 12, printed circuit board 40 has conductive contacts 42a–42f on top surface 44. Conductive contacts 42a–42f are soldered with solder 73a–73f to metallization layer 72a–72e to form an electrical contact between printed circuit board 40 and integrated circuit 52 through contact pad 54. The soldering material is a lead/tin alloy.

Figure 13:
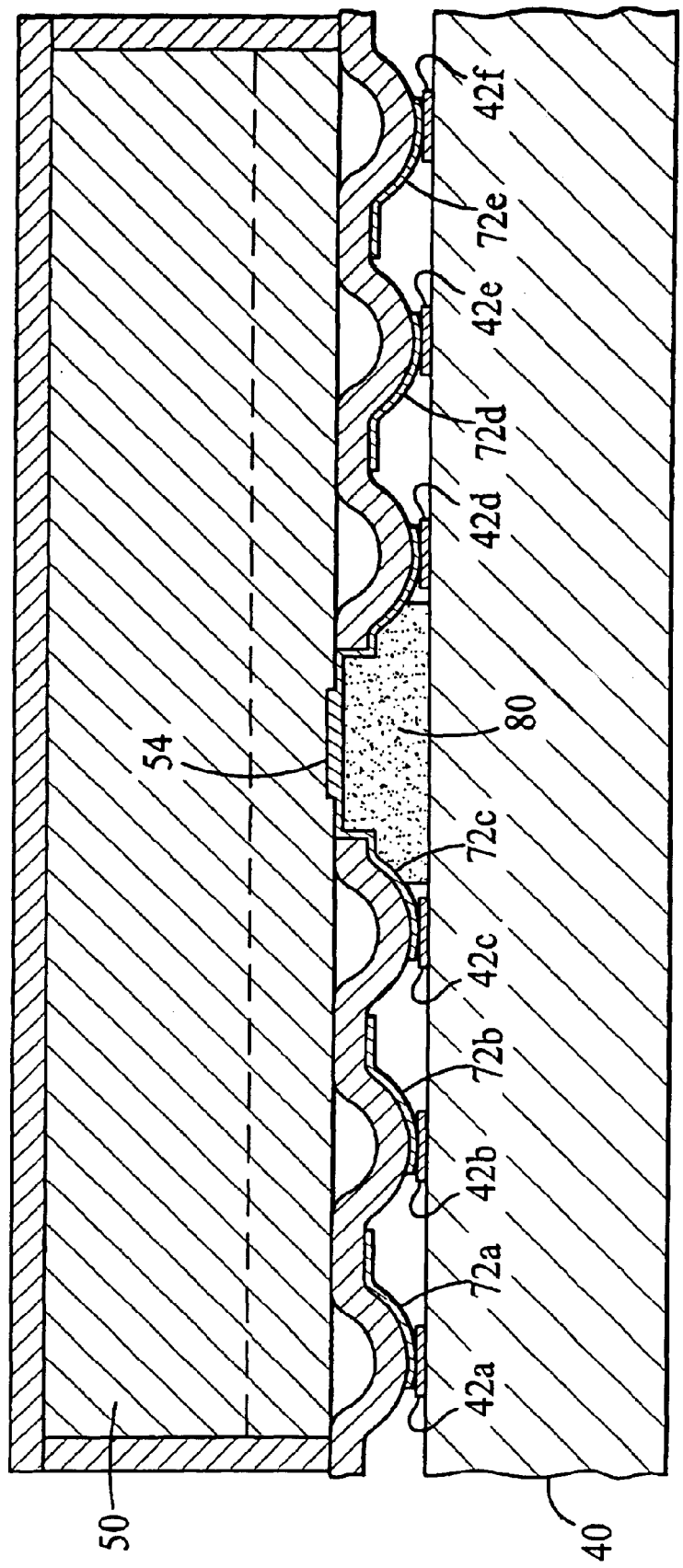

Referring to FIG. 13, in an alternative embodiment, metallization layer 72a–72e of die 50 is pressed against conductive contacts 42a–42f of printed circuit board 40. Die 50 is attached to board 40 by use of a non-conductive glue 80, e.g., epoxy 3609, manufactured by Loctite, based in Munich, Germany. Epoxy 3609 is an adhesive commonly used in surface mount technology. Glue 80 is cured under pressure, thereby securely affixing die 50 to board 40. In this position, printed circuit board 40 contacts contact pad 54 of integrated circuit 52 through metallization layer 72a–72e and conductive contacts 42a–42f.

A number of embodiments of the invention have been described. Nevertheless, it will be understood that various modifications may be made without departing from the spirit and scope of the invention. For example, the transfer substrate can be made of metal or polymer. The monoatomic layer deposited on the transfer substrate can be polyethylene or Teflon®. The monoatomic layer can be deposited on only a portion of the transfer substrate. The compliant dielectric layer can be deposited by spraying or electro-deposition. The compliant dielectric layer can be sprayed by a spin coater or a spray coater, manufactured by, e.g., Süss Micro-Tech AG. The dielectric layer can also be deposited on a glass substrate by printing. The dielectric layer can have a thickness within the range of 5 $\mu$m to 500 $\mu$m, preferably 50 $\mu$m to 200 $\mu$m. The bonding pad on the integrated circuit can be made of metals other than aluminum, such as gold or copper. The dielectric layer can be cured in an oven instead of a bonding machine. If an integrated circuit comprises a memory chip, the semiconductor substrate can undergo burn-in with a test board having the same dimensions as the substrate. The semiconductor substrate can be singulated into dies immediately after testing, or it can undergo further processing before it is singulated. Instead of soldering a singulated die to a printed circuit board, the die can be glued to the board by a conductive adhesive, e.g., conductive silicone. The distance between good dies on a transfer substrate can be between 50 $\mu$m and 500 $\mu$m. A die can be encapsulated on its sides by one type of encapsulating material and on its backside by a second type of encapsulating material. The encapsulating material can be dispensed using a fluid dispensing system such as the C-718 SMT, manufactured by Asymtek, Inc., based in Carlsbad, Calif. Accordingly, other embodiments are within the scope of the following claims.

What is claimed is:

1. A semiconductor structure, comprising:
   a semiconductor substrate;
   a compliant interconnect element disposed on a first surface of the substrate, said compliant interconnect element comprising a portion extending across and away from the first surface of the substrate to define a chamber between the first surface of the substrate and the portion of the compliant interconnect element;
   a first conducting pad on the substrate;
   a conducting layer, disposed on the compliant interconnect element in contact with the first conducting pad; and
   a plurality of conducting pads on the substrate,
   wherein the conductive layer comprises a plurality of lines, each of the lines contacting one of the plurality of conducting pads, the lines defining a pad redistribution pattern, the plurality of conducting pads have a first pitch and the lines define a pad distribution pattern have a second pitch.

2. The structure of claim 1, wherein the interconnect element comprises a compliant layer.

3. The structure of claim 2, wherein the compliant layer comprises a polymer.

4. The structure of claim 3, wherein the polymer comprises silicone.

5. The structure of claim 1, wherein the chamber is surrounded on all of its sides by the portion of the compliant interconnect element and the first surface of the substrate.

6. The structure of claim 1, wherein the chamber has a height within the range of about 50 $\mu$m to about 200 $\mu$m.

7. The structure of claim 2, wherein the compliant layer has a thickness within the range of about 5 $\mu$m to about 500 $\mu$m.

8. The structure of claim 1, wherein the substrate comprises a device.

9. The structure of claim 8, wherein the device comprises an integrated circuit.

10. The structure of claim 9, wherein the device comprises a micro-electro mechanical system.

11. The structure of claim 1, further comprising:
    an encapsulation layer disposed on a second surface of the semiconductor substrate.

12. The structure of claim 1, wherein the conducting layer comprises metal.

13. The structure of claim 12, wherein the metal is selected from the group consisting of titanium, copper, nickel, and gold.

14. The structure of claim 12, wherein the conducting layer has a thickness within the range of about 2 $\mu$m to about 5 $\mu$m.

15. The structure of claim 1, further comprising:
    a printed circuit board having a second conducting pad disposed thereon,
    wherein the second conducting pad is in electrical communication with the first conducting pad on the substrate via the conducting layer.

16. A method for forming a semiconductor structure, said method comprising:
    providing a semiconductor substrate;
    providing a compliant interconnect element on a first surface of the substrate, said compliant interconnect element comprising a portion extending across and away from the first surface of the substrate to define a chamber between the portion of the compliant interconnect element and the first surface of the substrate;
    disposing a first conducting pad on the substrate;
    disposing a conducting layer on the compliant interconnect element in contact with the first conducting pad; and
    disposing a plurality of conducting pads on the substrate,
    wherein the conductive layer comprises a plurality of lines, each of the lines contacting one of the plurality of conducting pads, the lines defining a pad redistribution pattern, the plurality of conducting pads have a first pitch and the lines define a pad distribution pattern have a second pitch.

17. The method of claim 16, providing the compliant interconnect element comprises providing a compliant layer.

18. The method of claim 17, wherein providing the compliant layer comprises providing a transfer substrate having a compliant layer disposed thereon.

19. The method of claim 18, wherein providing a transfer substrate comprises providing a glass substrate.

20. The method of claim 16, wherein providing a semiconductor substrate comprises a providing a plurality of singulated dies, each of said dies the including a semiconductor device.

21. The method of claim 20, further comprising:
    encapsulating each one of the plurality of singulated dies in a protective material to form a reconstituted wafer.

22. The structure of claim 1, wherein the first pitch is smaller in size than the second pitch.

23. The structure of claim 22, wherein the first pitch is about 150 $\mu$m and the second pitch is about 800 $\mu$m.

* * * * *